United States Patent

Kadota

Patent Number: 5,365,397
Date of Patent: Nov. 15, 1994

[54] DEVICE FOR PROTECTING POWER SEMICONDUCTOR DEVICE AGAINST SHORT CIRCUIT

[75] Inventor: Nagatoshi Kadota, Yokohama, Japan
[73] Assignee: Kabushiki Kaisha Toshiba, Kawasaki, Japan
[21] Appl. No.: 52,994
[22] Filed: Apr. 27, 1993
[30] Foreign Application Priority Data
Apr. 28, 1992 [JP] Japan .................... 4-109913
[51] Int. Cl.$^5$ ........................... H03K 17/56
[52] U.S. Cl. ........................ 361/93; 361/18
[58] Field of Search ........... 361/83, 18, 93, 56

[56] References Cited

U.S. PATENT DOCUMENTS

5,200,879 4/1993 Sasagawa et al. ............ 361/93

Primary Examiner—A. D. Pellinen
Assistant Examiner—Sally C. Medley
Attorney, Agent, or Firm—Finnegan, Henderson, Farabow, Garrett & Dunner

[57] ABSTRACT

A driving signal is supplied to the gate of an IGBT through a first switching element. The gate of the IGBT is grounded via a resistor and a second switching element. An output (short circuit detection signal) of an AND gate, to which the driving signal and an output signal of the IGBT are supplied, is supplied to the first switching element via a first delay circuit and supplied to the second switching element via a second delay circuit. The second delay time is larger than the first delay time. In the normal operation, the driving signal is set to an "L" level to instantaneously turn off the IGBT. The output of the AND gate is kept at the "H" level for the turn-off time and is returned to the "L" level after the turn-off operation is completed. The first switching element is turned off when the first delay time has passed after the level of the driving signal is changed. At this time, the IGBT is already turned off. When the short circuit is detected, the output of the AND gate is not returned to the "L" level if it is once set to the "H" level so that the first switching element will be turned off to isolate the IGBT. Then, the second switching element is turned on when the second delay time has passed after the detection of the short circuit, permitting charges stored in the IGBT to be discharged to turn off the IGBT.

11 Claims, 11 Drawing Sheets

DEVICE FOR PROTECTING POWER SEMICONDUCTOR DEVICE AGAINST SHORT CIRCUIT

BACKGROUND OF THE INVENTION

1. Field of the Invention

The present invention relates to a device for protecting a power semiconductor device such as an insulated gate bipolar transistor (IGBT) or metal oxide semiconductor field effect transistor (MOSFET) against a short circuit.

2. Description of the Related Art

Conventionally, the protection of a power semiconductor device such as an IGBT from a short circuit is made as follows. First, a short-circuit current is detected and a detection signal thereof is transmitted to a control circuit via an insulated signal coupling means such as a photocoupler. The control circuit drives a driving circuit to supply a turn-off signal to the power semiconductor device, thus protecting the power semiconductor device from the short circuit.

Figure 1:
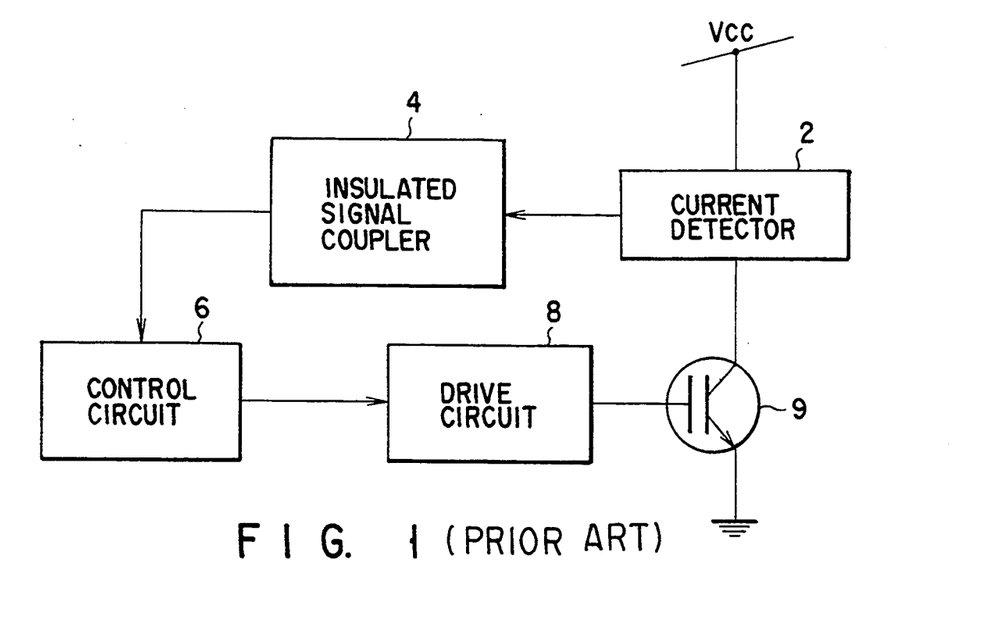
FIG. 1 is a circuit diagram showing the construction of one example of a conventional protective device for protecting a power semiconductor device against a short circuit.

FIG. 1 shows an example of a conventional protective device against short circuit using a current detector 2 as a means for detecting a short-circuit current. When the current detector 2 detects the short-circuit current, a detection signal thereof is supplied to a control circuit 6 via an insulated signal coupling circuit 4 such as a photocoupler. The control circuit 6 causes a driving circuit 8 to output a turn-off signal so as to turn off an N-channel IGBT 9.

Figure 2:
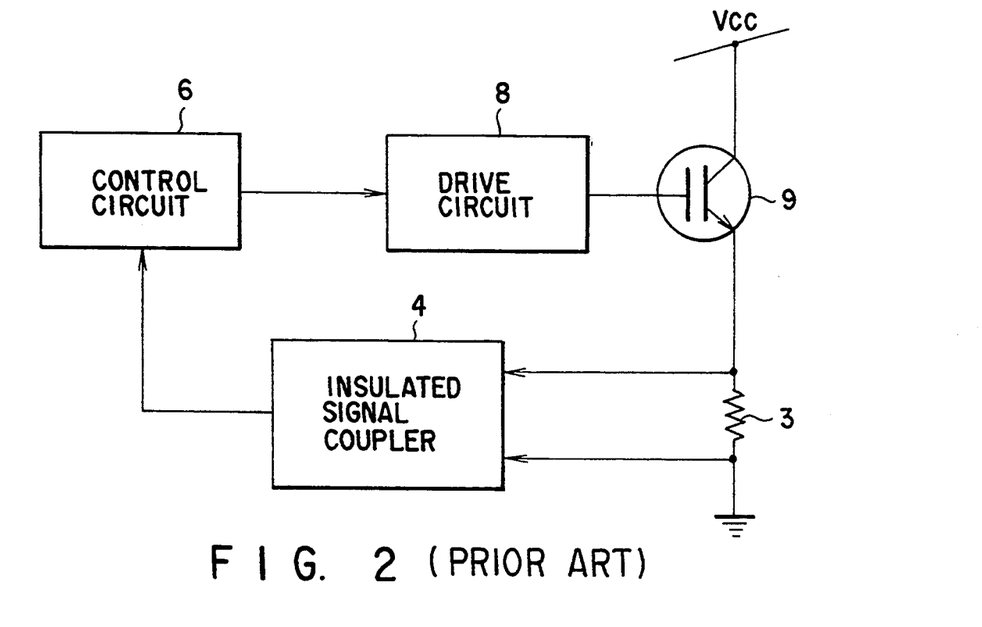
FIG. 2 is a circuit diagram showing the construction of another example of a conventional protective device for protecting a power semiconductor device against a short circuit.

FIG. 2 shows an example of a conventional protective device against short circuit using a resistor 3 having a large power capacity instead of the current detector 2 as a means for detecting a short-circuit current. The resistor 3 detects a short-circuit current based on a potential difference between the voltages at both ends thereof and the detection signal is supplied to the control circuit 6 via the insulated signal coupling circuit 4. The control circuit 6 causes the driving circuit 8 to output a turn-off signal so as to 10 turn off the IGBT 9.

In the above conventional cases, it is necessary to use the current detector 2 for detecting a short-circuit current or the resistor 3 having a large power capacity and it is necessary to provide a relatively large space to dispose them, thereby increasing the size of the device. Further, use of the current detector 2 or resistor 3 increases the cost of the device.

Further, since the detection signal of the short-circuit current is supplied to the control circuit 6 via the insulated signal coupling circuit 4, it takes a relatively long delay time from the time of generation (detection) of the short circuit until a turn-off signal is actually transmitted to the IGBT 9, and there occurs a possibility that energy of an amount larger than the breakdown amount of the IGBT 9 by the short-circuit current is applied to the IGBT 9 in the above delay time to break down the IGBT 9.

Further, the short-circuit current is several times to several tens of times larger than a current flowing in the normal operation. Therefore, di/dt of the short-circuit current at the time of turn-off is several times to several tens of times larger than di/dt of the current at the time of turn-off in the normal operation. As a result, an excessively high voltage called a spike voltage occurs at the output terminal of the IGBT 9, causing a possibility that the IGBT 9 may be broken down.

As described above, the conventional protective device for protecting the power semiconductor device against short circuit has the following defects.

(1) It is necessary to provide a large space in order to dispose a short-circuit current detection means.

(2) Use of the short-circuit current detection means increases the cost.

(3) Since a short-circuit detection signal is fed back to the driving circuit via the insulated signal coupling means, delay time occurs in the operation to delay generation of a turn-off signal used for protecting the power semiconductor device, thereby permitting a short-circuit current to flow in the power semiconductor device for a long period of time and breaking down the semiconductor device.

(4) A high voltage is output at the output terminal of the semiconductor device by di/dt of the short-circuit current when the semiconductor device is turned off after the detection of the short-circuit current, thereby breaking down the semiconductor device.

SUMMARY OF THE INVENTION

Accordingly, it is an object of the present invention to provide a small and inexpensive protective device for protecting a power semiconductor device against short circuit, which can stably prevent the semiconductor device from being broken down when a load is short-circuited.

According to the present invention, there is provided a protective device for protecting a power semiconductor device against a short circuit comprises:

means for generating a control signal to control the ON-OFF state of the semiconductor device;

switching means connected between the control signal generation means and a control terminal of the semiconductor device;

means for detecting the short circuit of a load according to the potential of the control signal and the potential at the output terminal of the semiconductor device;

means for switching off the switching means when a first preset time has passed after the short circuit detection means detects a short circuit and isolating the control means and semiconductor device from each other; and turn-off means for turning off the semiconductor device when a second preset time longer than the first preset time has passed after the short circuit detection means detects a short circuit.

According to the protective circuit against the short circuit of the present invention, since a circuit exclusively used for turning off the short-circuit current is provided in addition to a turn-off circuit used in the normal operation, the short-circuit current can be slowly turned off, thereby preventing occurrence of a spike voltage which may cause the breakdown of the semiconductor device. Further, a short-circuit state detection signal can be transmitted to the semiconductor device as a turn-off signal before the semiconductor device is broken down, thus preventing the breakdown of the semiconductor device with high reliability. In addition, since neither the current detector nor the large capacity resistor is used, the semiconductor device can be easily integrated at a low manufacturing cost.

Additional objects and advantages of the present invention will be set forth in the description which follows, and in part will be obvious from the description, or may be learned by practice of the present invention. The objects and advantages of the present invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the present invention and, together with the general description given above and the detailed description of the preferred embodiments given below, serve to explain the principles of the present invention in which.

DETAILED DESCRIPTION OF THE PREFERRED EMBODIMENTS

A preferred embodiment of a protective device for protecting a power semiconductor device against a short circuit according to the present invention will now be described with reference to the accompanying drawings.

Figure 3:
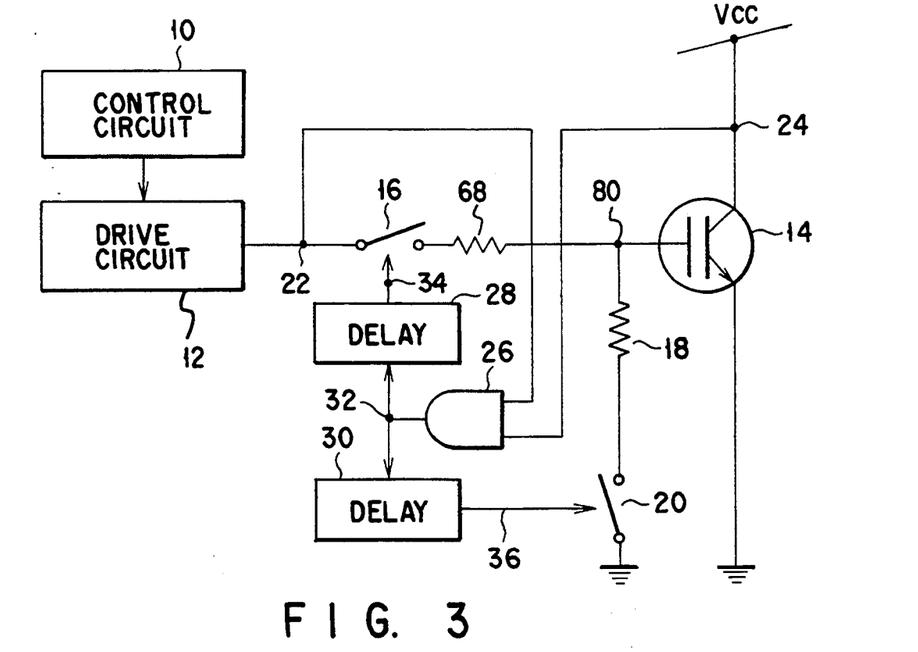
FIG. 3 is a circuit diagram showing the construction of a first embodiment of a protective device for protecting a power semiconductor device against a short circuit according to the present invention.

FIG. 3 is a circuit diagram showing a first embodiment of the present invention. In this embodiment, an IGBT for controlling a load such as a motor is used as a power semiconductor device and a protective circuit against short circuit added to a driving circuit therefor is explained. Only one IGBT 14 is shown in FIG. 3, but when a motor or the like is controlled, IGBTs are connected in a bridge form to construct an inverter.

A control circuit 10 for controlling the load by controlling the ON-OFF state of the IGBT 14 is provided and a control signal from the control circuit 10 is amplified by a driving circuit 12 to such a level which is sufficiently high to drive the IGBT 14. A driving signal output from the driving circuit 12 is supplied to the gate (control terminal) of the IGBT 14 via a switching element 16. The emitter of the IGBT 14 is grounded and the collector thereof is connected to a positive power source vcc and to a load (not shown). The gate of the IGBT 14 (node 80) is grounded via a resistor 18 and switching element 20.

The resistor 18 constructs a discharging circuit for discharging charges stored between the gate and emitter of the IGBT 14 when a short circuit occurs. Therefore, if the resistance of the resistor 18 is set to a sufficiently large value, the IGBT 14 can be slowly turned off and a spike voltage caused by di/dt of the short-circuit current at the turn-off time can be set lower than the withstanding voltage, thereby making it possible to prevent the breakdown of the IGBT 14 by the spike voltage. The level of the node 80 (gate of the IGBT 14) is lowered with a time constant $\tau$ ($=R_{68} \times C_{ies}$; $R_{68}$ is a resistance of the resistor 68 and $C_{ies}$ is an input capacitance of the IGBT 14) after the level of a node 22 (output terminal of the drive circuit 12) is lowered at the time of normal operation.

An output terminal 22 of the driving circuit 12 and an output terminal (emitter) 24 of the IGBT 14 are connected to an input terminal of an AND gate 26 in order to detect a short circuit. An output signal of the AND gate 26 is supplied to the control terminal of the switching element 16 via a delay circuit 28 and to the control terminal of the switching element 20 via a delay circuit 30. The delay time $td_1$ of the delay circuit 28 is set to be longer than the turn-on time t on of the IGBT 14. The delay time $td_2$ of the delay circuit 30 is set to be longer than $td_1 + t_{on} + t_1$ but shorter than [(breakdown time of the IGBT 14 by the short circuit)—(turn-off time of the IGBT 14 at the time of short circuit)]. The delay time $td_2$ of the delay circuit 30 may be determined based on a breakdown time of the IGBT 14. Since a circuit exclusively used for turning off the short-circuit current is provided in the present invention, the turn-off time at the time of normal operation and the turn-off time at the time of short circuit are different from each other. The turn-off time at the time of normal operation is shorter than the turn-off time at the time of short circuit. The turnoff time is determined by a time constant $\tau$ of a discharge circuit ($=R_g \times C_{ies}$).

The switching element 16 is turned on when an output signal of the delay circuit 28 is set at a low logic level (which is hereinafter simply referred to as "L" level) and turned off when the output signal is set at a high logic level (which is hereinafter simply referred to as "H" level). The switching element 20 is turned on when an output signal of the delay circuit 30 is set at the "H" level and turned off when the output signal is set at the "L" level.

Figure 4:
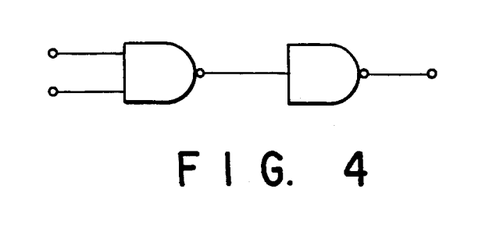
FIG. 4 is a diagram showing a modification of an AND gate shown in FIG. 3.
Figure 5:
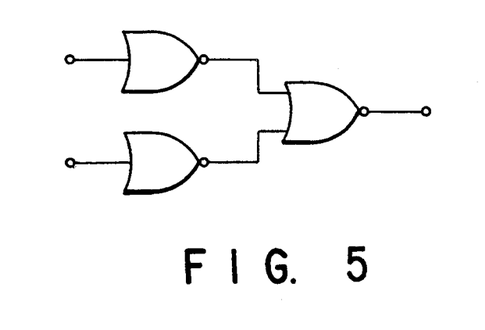
FIG. 5 is a diagram showing another modification of the AND gate shown in FIG. 3.

The AND gate 26 may be constructed by use of a NAND gate as shown in FIG. 4 or by use of a NOR gate as shown in FIG. 5.

Figure 6:
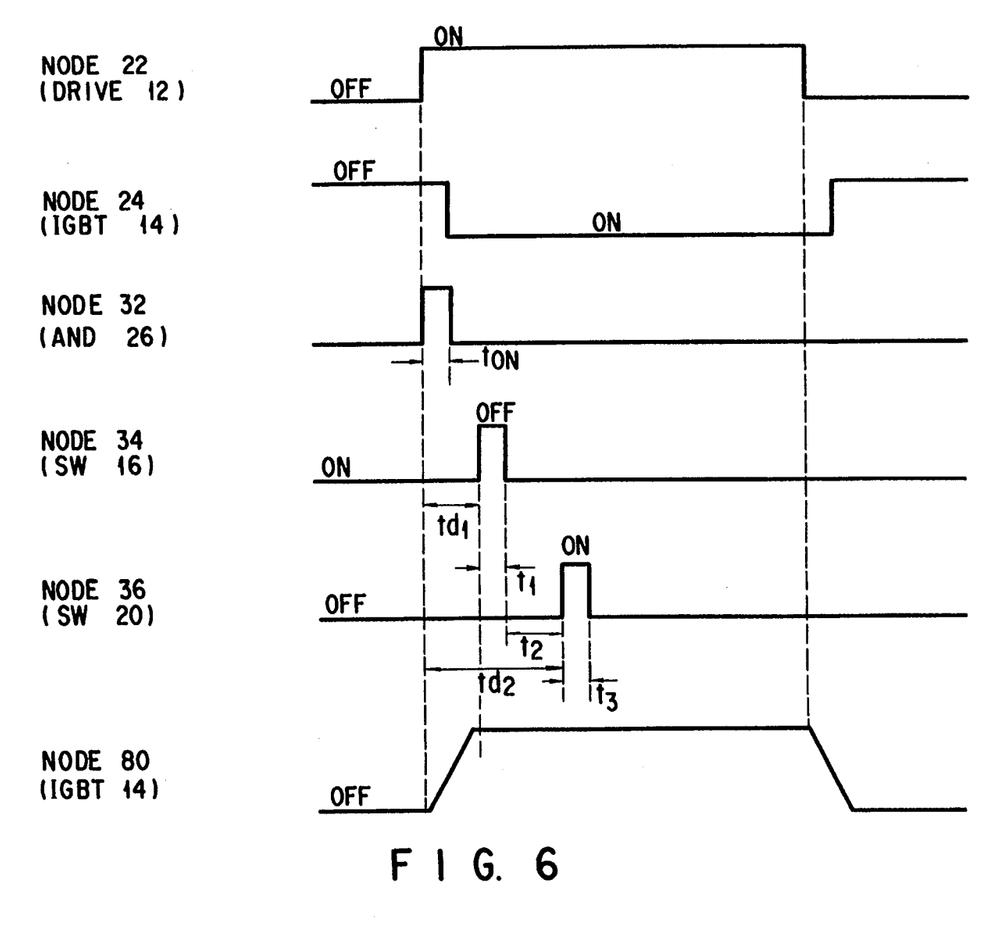
FIG. 6 is a timing chart for illustrating the operation of the first embodiment in the normal state.

Next, the operation of the first embodiment shown in FIG. 3 is explained with reference to the timing chart shown in FIG. 6.

When the IGBT 14 is kept in the OFF state, the signal at the output node 22 of the driving circuit 12 is set at the "L" level and the signal at the output node 24 of the IGBT 14 is set at the "H" level. Therefore, an output node 32 of the AND gate 26 is set to the "L" level, the switching element 16 is set in the ON state and the switching element 20 is set in the OFF state.

When the IGBT 14 is turned on, the output node 22 of the driving circuit 12 is set to the "H" level. As a result, the output node 32 of the AND gate 26 is set to the "H" level. However, the switching element 16 is not immediately turned off but kept "on-state" for a period of time $td_1$ due to the operation of the delay circuit 28. The driving signal of "H" level is kept supplied to the gate of the IGBT 14. As a result, the voltage of the gate of the IGBT 14 (node 80) rises and the IGBT 14 is turned on.

Then, when the delay time $td_1$ has passed after the output node 22 of the driving circuit 12 is set to the "H" level, the output node 34 of the delay circuit 28 is set to the "H" level to turn off the switching element 16. The supply of the driving signal of "H" level to the gate of the IGBT 14 is stopped for a period of time $t_1$. However, the charges stored in the gate-emitter terminals of the IGBT 14 are held so that the IGBT 14 is kept turned on even if the driving signal of "H" level is not supplied thereto.

Further, when the delay time $td_2$ has passed after the output node 22 of the driving circuit 12 is set to the "H" level, the output node 36 of the delay circuit 30 is set to the "H" level to turn on the switching element 20. The gate-emitter voltage of the IGBT 14 is almost zero since the switching element 16 is ON state, the resistance of the resistor 68 is much smaller than that of the resistor 18, and a turn-on time $t_3$ of the switching element 20 is very short, therefore, the IGBT 14 is kept in the ON state.

When the IGBT 14 is turned off, the output node 22 of the driving circuit 12 is changed from the "H" level to the "L" level. The output node 24 of the IGBT 14 is changed to the "H" level when the turn-off time of the IGBT 14 has passed after the output node 22 of the driving circuit 12 is set to the "L" level. Therefore, the output node 32 of the AND gate 26 is kept at the "L" level in the turn-off operation of the IGBT 14.

Figure 7:
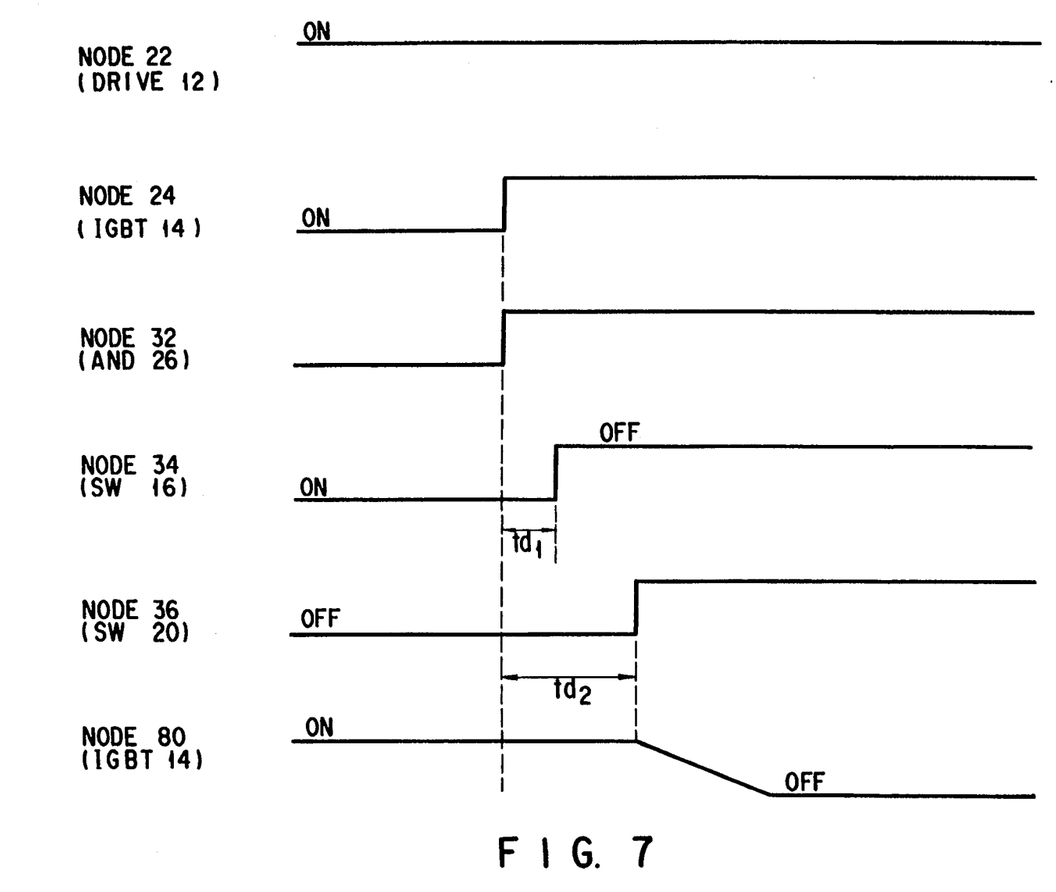
FIG. 7 is a timing chart for illustrating the protection operation at the time of occurrence of the short circuit in the first embodiment.

The normal operation has been described above, but the protecting operation effected when a load (not shown) is short-circuited for some reasons so as to cause a short-circuit current to flow in the IGBT 14 is explained below with reference to the timing chart shown in FIG. 7. When the IGBT 14 is set in the ON state, the output node 22 of the driving circuit 12 is set at the "H" level. When a short circuit occurs, the output node 24 of the IGBT 14 is also set to the "H" level. Therefore, the output node 32 of the AND gate 26 is set to the "H" level, and after the delay time $td_1$ of the delay circuit 28 has passed, the switching element 16 is set into the OFF state. As a result, the driving circuit 12 is isolated from the gate terminal of the IGBT 14. Unlike the case of the normal turn-off operation, since an output of the AND gate 26 is not returned to the "L" level, the switching element 16 is kept in the OFF state.

Further, when the delay time $td_2$ of the delay circuit 30 has passed after the output node 24 of the IGBT 14 is set to the "H" level, the switching element 20 is set into the ON state, thereby discharging charges stored between the gate and emitter of the IGBT 14. As a result, the IGBT 14 is turned off to prevent a short-circuit current from flowing into the IGBT 14.

Thus, according to the first embodiment, since the gate terminal of the IGBT 14 is set to the "L" level with the switching element 16 kept in the ON state in order to turn off the IGBT 14 in the normal operation, it can be rapidly turned off.

In order to turn off the IGBT 14 in the short-circuit state, the gate of the IGBT 14 is isolated from the driving circuit 12 to interrupt application of the bias by turning off the switching element 16 when the delay time of the delay circuit 28 has passed after the short circuit is detected, and after the delay time of the delay circuit 30 has passed, charges stored between the gate and emitter of the IGBT 14 are discharged via the resistor 18 to turn off the IGBT 14. In this case, a short-circuit current will flow into the IGBT 14 for a period of [(delay time of the delay circuit 30) + (time constant of the discharging circuit)], but the delay time and time constant are so determined that the IGBT 14 will not be broken down in the above period. Further, since the discharging time constant is set to a sufficiently large value so as to prevent occurrence of a spike voltage by the turn-off of the short-circuit current, the IGBT 14 can be prevented from being broken down by the turn-off of the short-circuit current.

Further, according to this embodiment, since the short circuit is detected by checking the potentials of the output node of the driving circuit 12 and the output node of the IGBT 14, it is not necessary to provide a large-sized and expensive current detector or a resistor of large power capacity unlike the conventional case.

Next, another embodiments of the present invention will be explained. In the following explanation, portions corresponding to those of the first embodiment are denoted by the same reference numerals and the detail explanation therefor is omitted. Like the first embodiment, the AND gate can be constructed by a NAND gate or NOR gate.

Figure 8:
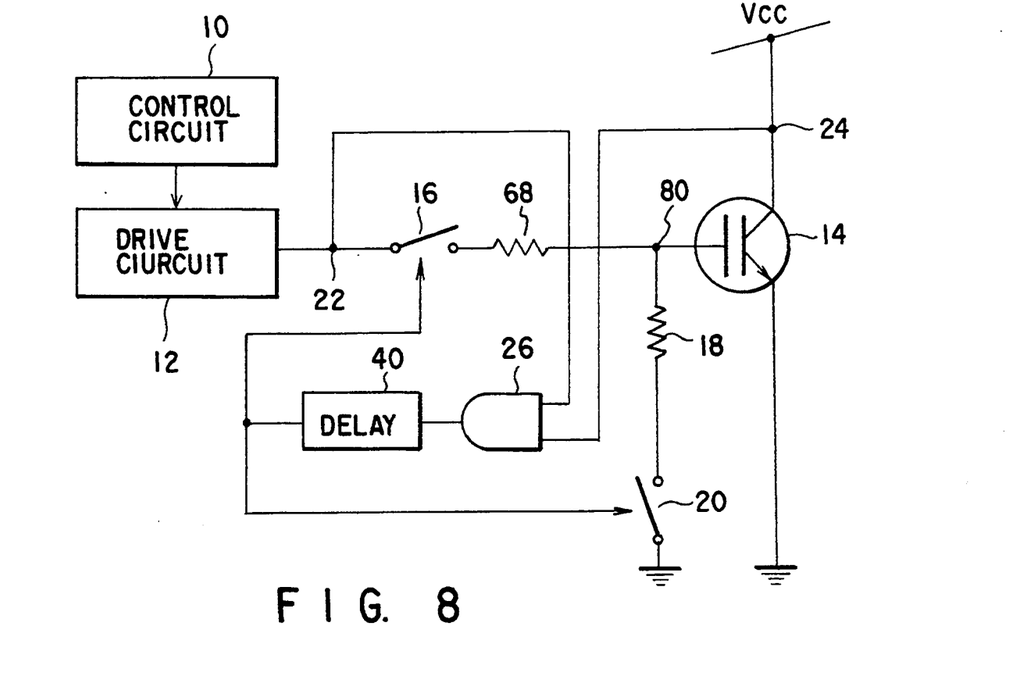
FIG. 8 is a circuit diagram showing the construction of a second embodiment of a protective device for protecting a power semiconductor device against a short circuit according to the present invention.

FIG. 8 is a circuit diagram of the second embodiment. In the second embodiment, the delay circuits 28 and 30 in the first embodiment are omitted and the switching elements 16 and 20 are commonly controlled by an output of a delay circuit 40 which is connected to the output of the AND gate 26. The other portions of the second embodiment are the same as a corresponding portion of the first embodiment. In this embodiment, it is necessary to adjust the time constant of the discharge circuit including the resistor 18 so as to satisfy the relation shown FIGS. 6 and 7.

Figure 9:
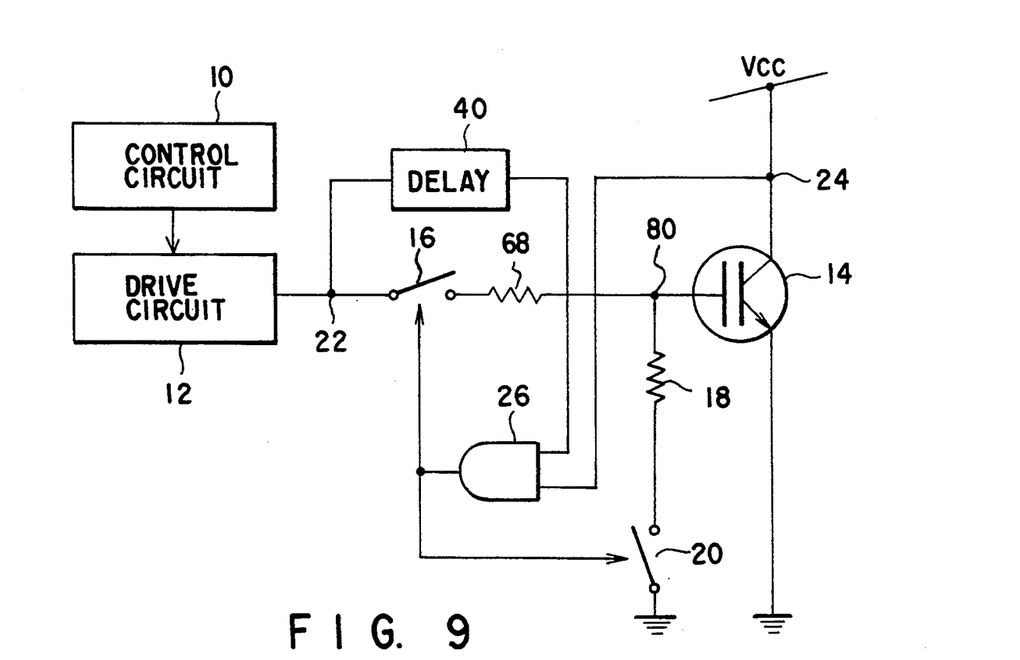
FIG. 9 is a circuit diagram showing the construction of a third embodiment of a protective device for protecting a power semiconductor device against a short circuit according to the present invention.

FIG. 9 is a circuit diagram of a third embodiment. The third embodiment is similar to the second embodiment except that the delay circuit 40 is connected between the output node 22 of the driving circuit 12 and the input terminal of the AND gate 26.

Figure 10:
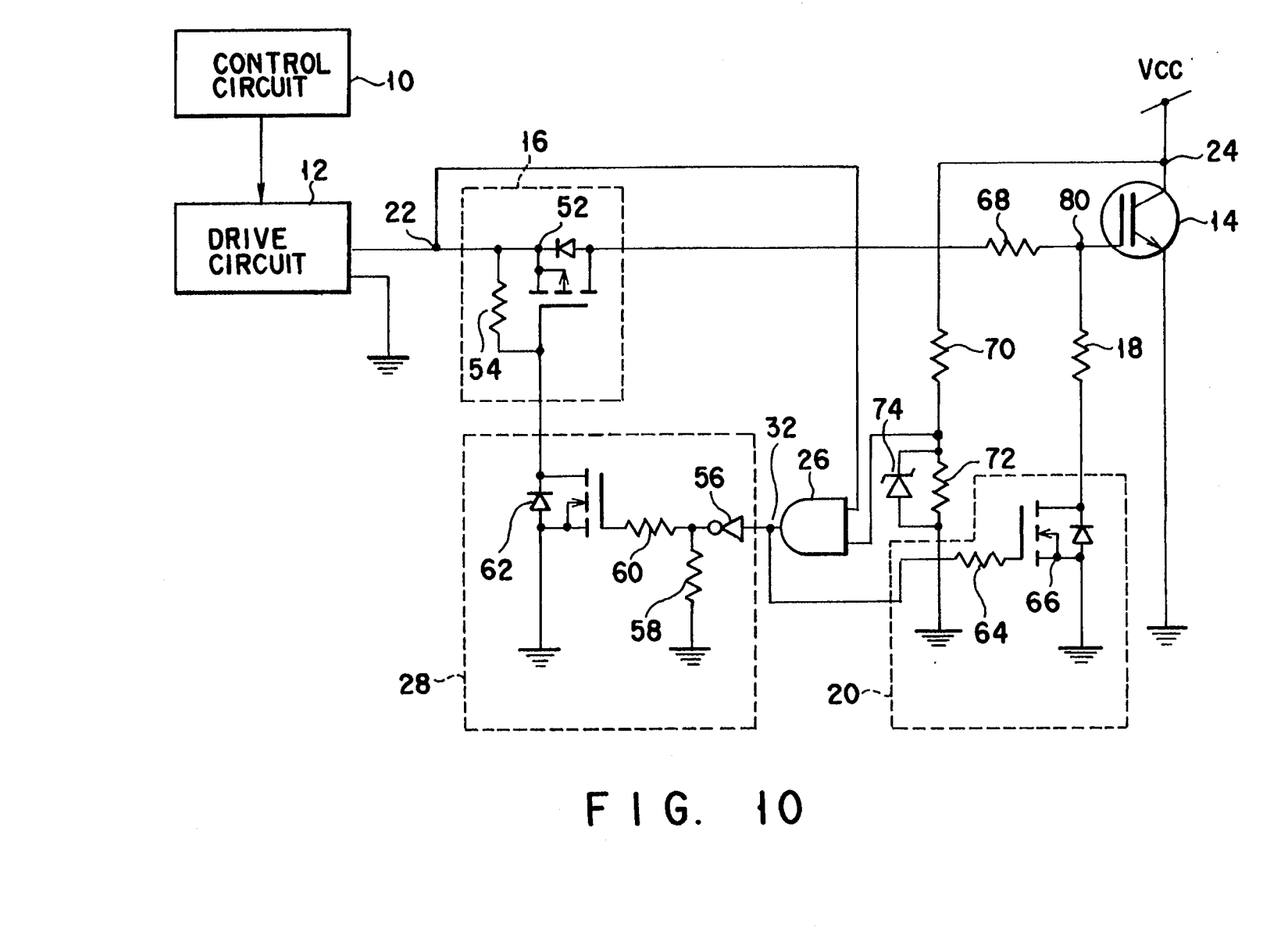
FIG. 10 is a circuit diagram showing the construction of a fourth embodiment of a protective device for protecting a power semiconductor device against a short circuit according to the present invention.

FIG. 10 is a circuit diagram of a fourth embodiment. The fourth embodiment is obtained by providing the delay circuit 30 in the switching element 20 in the first embodiment. The switching element 16 is a P-channel MOSFET 52 whose gate and source are connected to each other via a resistor 54. The delay circuit 28 includes an inverter 56 connected to receive an output of the AND gate 26, resistors 58 and 60 connected at one end to an output terminal of the inverter 56, and an N-channel MOSFET 62 whose gate is connected to the other end of the resistor 60. That is, the operation of the N-channel MOSFET 62 is delayed according to the CR time constant determined by the inverter 56, resistors 58 and 60, and the gate input capacitance of the N-channel MOSFET 62.

Further, the switching element 20 includes an N-channel MOSFET 66 and a resistor 64 for transmitting an output of the AND gate 26 to the gate of the N-channel MOSFET 66, and an output of the AND gate 26 is delayed according to the CR time constant determined by the resistor 64 and input capacitance of the N-channel MOSFET 66 so as to delay the operation of the N-channel MOSFET 66.

The switching element 16 is connected to the gate of the IGBT 14 via a resistor 68. The output node 24 of the IGBT 14 is grounded via series-connected resistors 70 and 72 and a serial connection node between the resistors 70 and 72 is connected to the input terminals of the AND gate 26. A Zener diode 74 whose anode is grounded is connected in parallel with the resistor 72.

The operation of the fourth embodiment is the same as that of the first embodiment. That is, in the normal operation, the signal levels of the output nodes 22 and 24 are set in the inverted relation. Therefore, the signal level of the output node 32 of the AND gate 26 is set at the "L" level and the MOSFET 66 is set in the OFF state. Since the MOSFET 62 supplied with an output of the inverter 56 is set in the ON state, it becomes possible to control the ON-OFF state of the IGBT 14 by applying a bias voltage between the gate and source of the MOSFET 52. If the signal level at the output node 22 of the driving circuit 12 is set at the "H" level, a turn-on signal is supplied between the gate and emitter of the IGBT 14 via the MOSFET 52 and the resistor 68 to turn on the IGBT 14. If the signal level at the output node 22 of the driving circuit 12 is set at the "L" level, charges stored between the gate and emitter of the IGBT 14 are discharged via the resistor 68 and MOSFET 52.

When a short-circuit current flows, the signal levels of the output nodes 22 and 24 are both set at the "H" level and the output node 32 of the AND gate 26 is set at the "H" level. As a result, the MOSFET 62 is turned off and will not apply a bias to the MOSFET 52. Therefore, charges stored between the gate and source of the MOSFET 52 are discharged via the resistor 54 and then the driving circuit 12 and the IGBT 14 are electrically isolated from each other. The gate of the MOSFET 66 is supplied with a signal level ("H" level) of the output node of the AND gate 26 and is turned on. As a result, charges stored between the gate and emitter of the IGBT 14 are discharged via the resistor 18 and MOSFET 66, thus turning off the IGBT 14.

Figure 11:
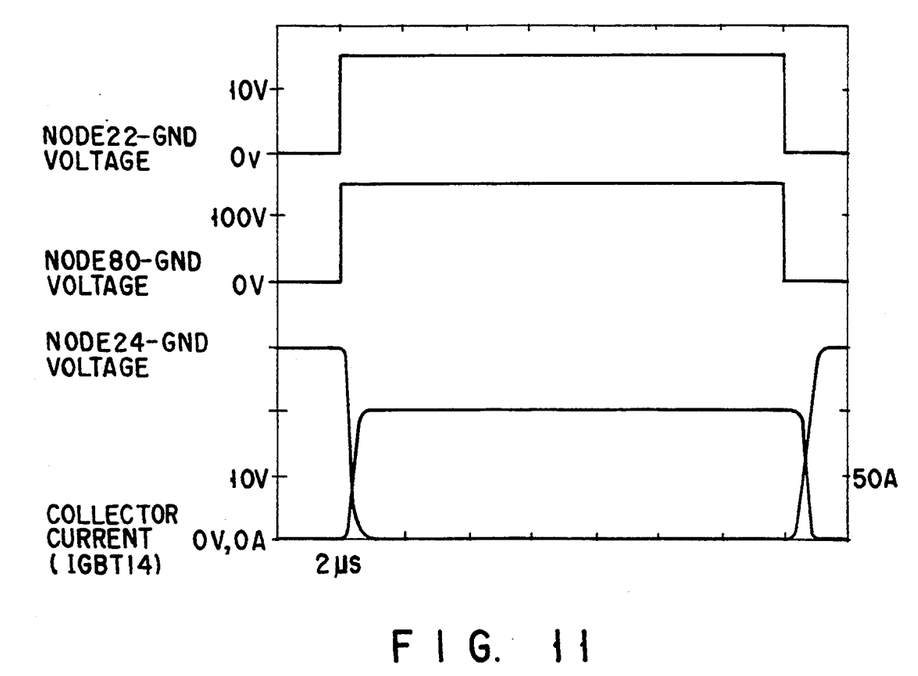
FIG. 11 is a waveform diagram for illustrating the operation of the fourth embodiment in the normal state.
Figure 12:
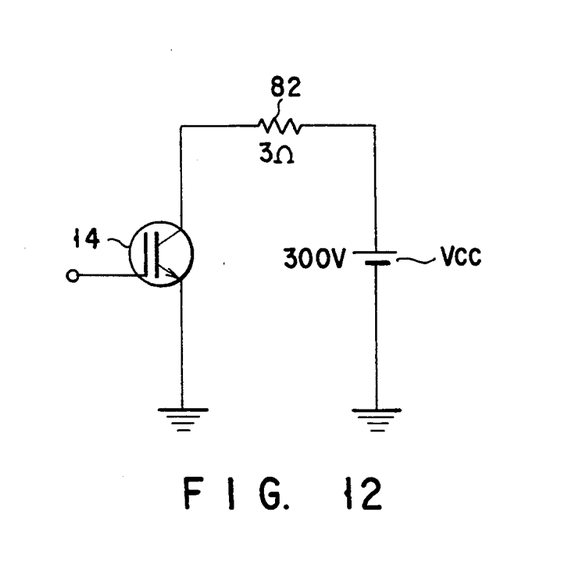
FIG. 12 is a circuit diagram showing the construction made when the waveform shown in FIG. 11 is obtained.

FIG. 11 is a waveform diagram for illustrating the switching operation of the circuit of FIG. 10 at the normal operation time. The abscissa indicates 2 μs/division and the ordinate indicates 10 V/division for the node 22-ground voltage, 100 V/division for the node 80-ground voltage, 10 V/division for the node 24-ground voltage, and 50 A/division for the collector current of the IGBT 14. The waveforms were obtained in a condition that a power source voltage Vcc of 300 V is applied to the collector of the IGBT 14 via the resistor 82 of 3 Ω serving as a load as shown in FIG. 12.

Figure 13:
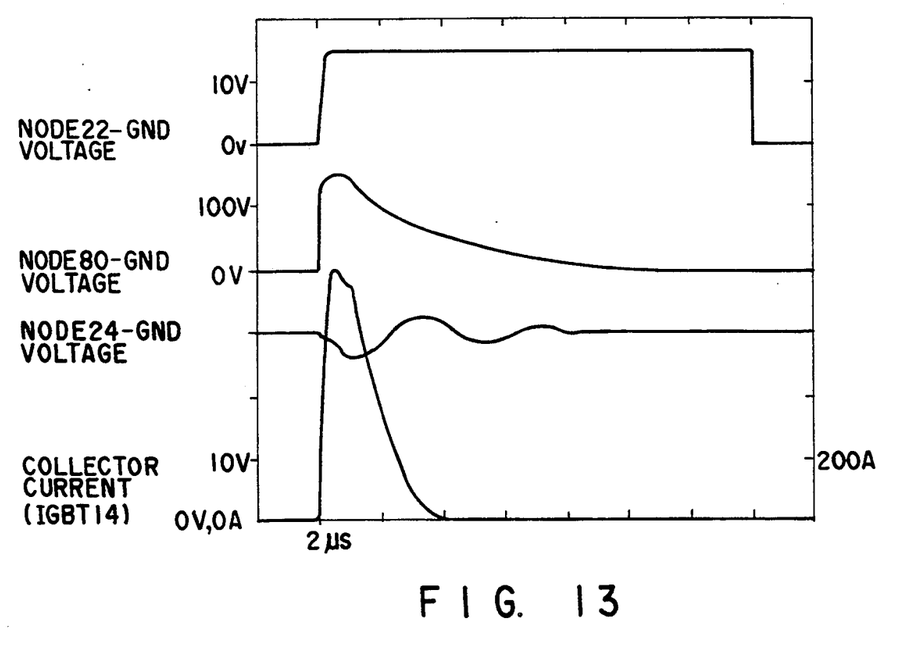
FIG. 13 is a waveform diagram for illustrating the operation of the fourth embodiment at the time of occurrence of short circuit.
Figure 14:
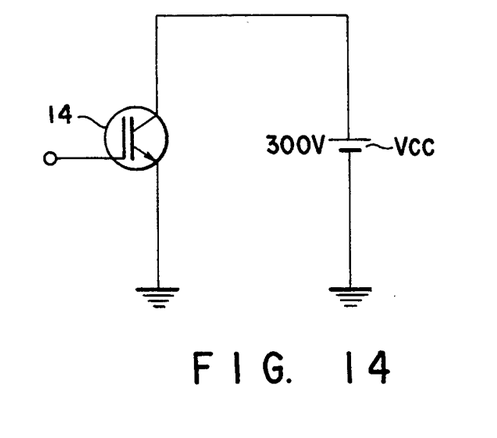
FIG. 14 is a circuit diagram showing the construction made when the waveform shown in FIG. 13 is obtained.

FIG. 13 is a waveform diagram for illustrating the switching operation of the circuit shown in FIG. 10 at the time of protection against the short circuit. The abscissa indicates 2 μs/division and the ordinate indicates 10 V/division for the node 22-ground voltage, 100 V/division for the node 80-ground voltage, 10 V/division for the node 24-ground voltage, and 200 A/division for the collector current of the IGBT 14. The waveforms were obtained in a condition that a power source voltage Vcc of 300 V is applied to the collector of the IGBT 14 as shown in FIG. 14. As is understood from FIG. 13, the protection operation is started approx. 1 μs after detection of the short circuit and the IGBT 14 is turned on after approx. 3 μs. It is assumed that the IGBT 14 in FIG. 10 is an N-channel IGBT whose withstanding voltage is 600 V and whose rated current is 100 A.

A period (td₂=1 μs) from the time of detection of the short circuit until the protection operation is started can be adjusted by changing the resistances of the resistors 54 and 60 in FIG. 10. A period from the time the protection operation is started until the IGBT 14 is turned off can be adjusted by changing the resistance of the resistor 18 in FIG. 10.

Figure 15:
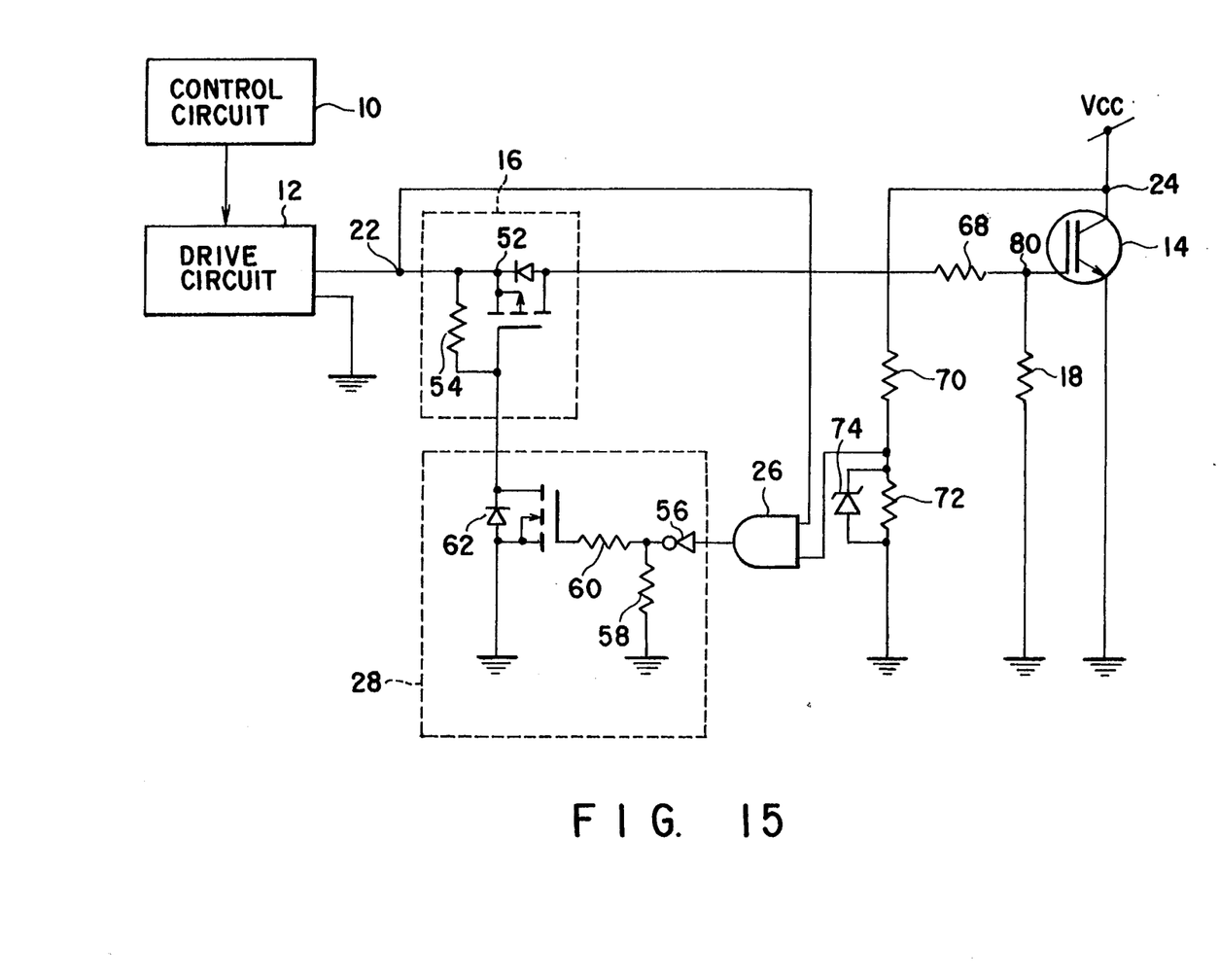
FIG. 15 is a circuit diagram showing the construction of a fifth embodiment of a protective device for protecting a power semiconductor device against a short circuit according to the present invention.

FIG. 15 is a circuit diagram of a fifth embodiment which is constructed by removing the switching element 20, that is, the resistor 64 and MOSFET 66 of the fourth embodiment. If the resistance of the resistor 68 in the fourth embodiment is sufficiently smaller than the resistance of the resistor 18 and has a value which can be used to effect the protection operation against the short circuit, the resistor 64 and MOSFET 66 can be omitted.

Figure 16:
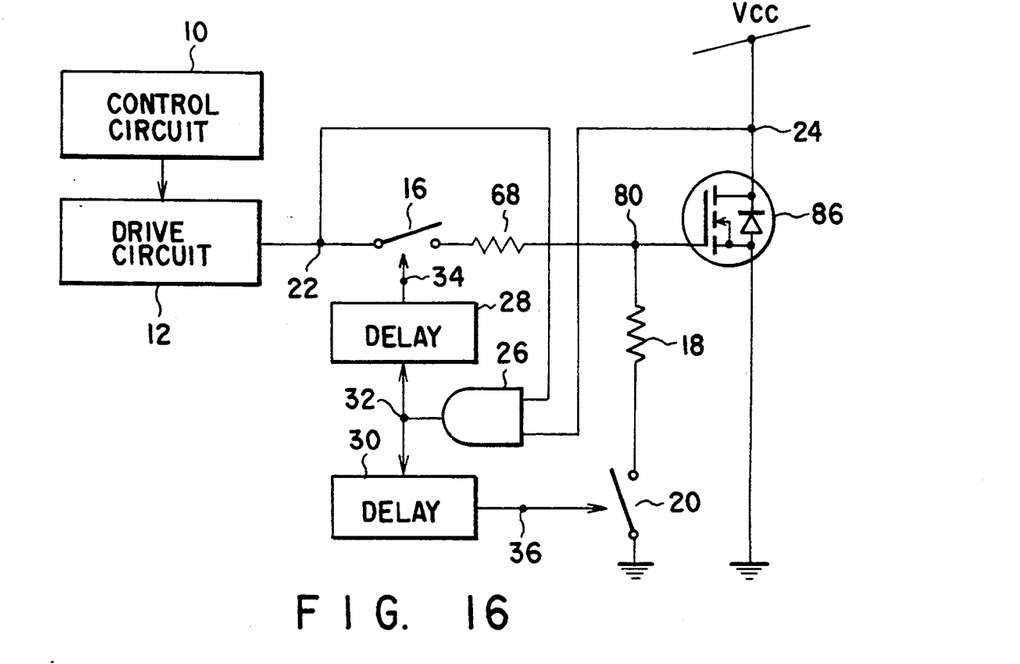
FIG. 16 is a circuit diagram showing the construction of a sixth embodiment of a protective device for protecting a power semiconductor device against a short circuit according to the present invention.

A power semiconductor device to be protected in the present invention is not limited to the IGBT but the present invention can be applied to various types of semiconductor devices. For example, an MOSFET can be used instead of the IGBT. Each of the above five embodiments can be applied to an MOSFET, but as one example, a sixth embodiment which can be obtained by using an MOSFET 86 instead of the IGBT 14 in the first embodiment shown in FIG. 3 is shown in FIG. 16.

Figure 17:
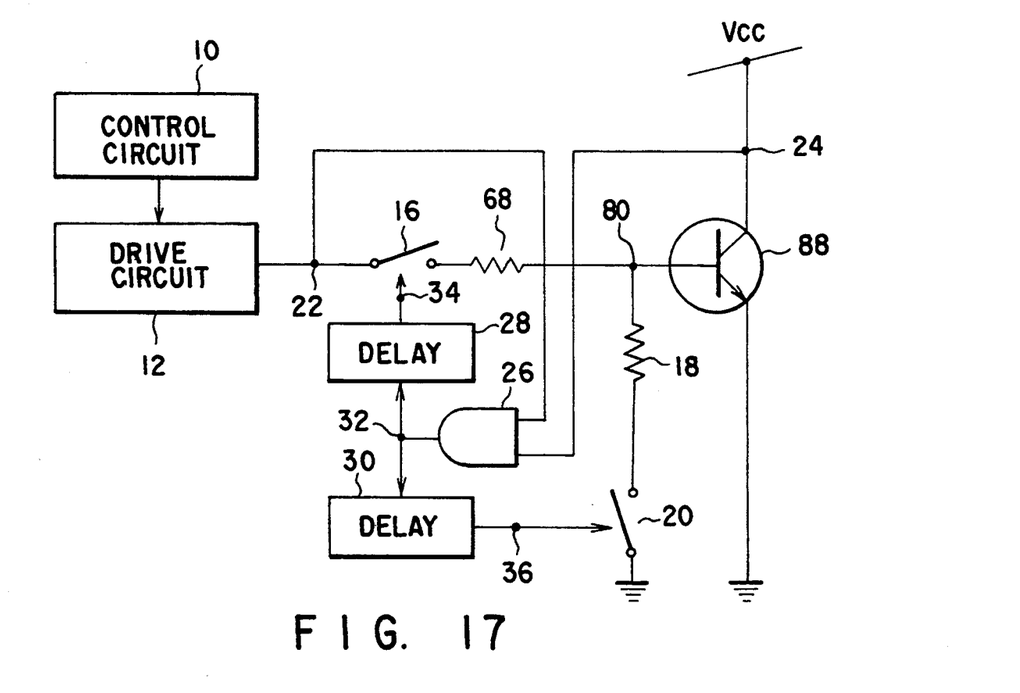
FIG. 17 is a circuit diagram showing the construction of a seventh embodiment of a protective device for protecting a power semiconductor device against a short circuit according to the present invention.

Likewise, each of the above five embodiments can be applied to a normal bipolar transistor, but as one example, a seventh embodiment which can be obtained by using a bipolar transistor 88 instead of the IGBT 14 in the first embodiment is shown in FIG. 17.

The ON-OFF state of the power semiconductor device such as an IGBT or IGFET can be controlled by application of a positive bias and 0 V, but is often controlled by application of positive and negative biases. One example of the protective device against the short circuit applied to a positive and negative bias application driving circuit is explained below.

Figure 18:
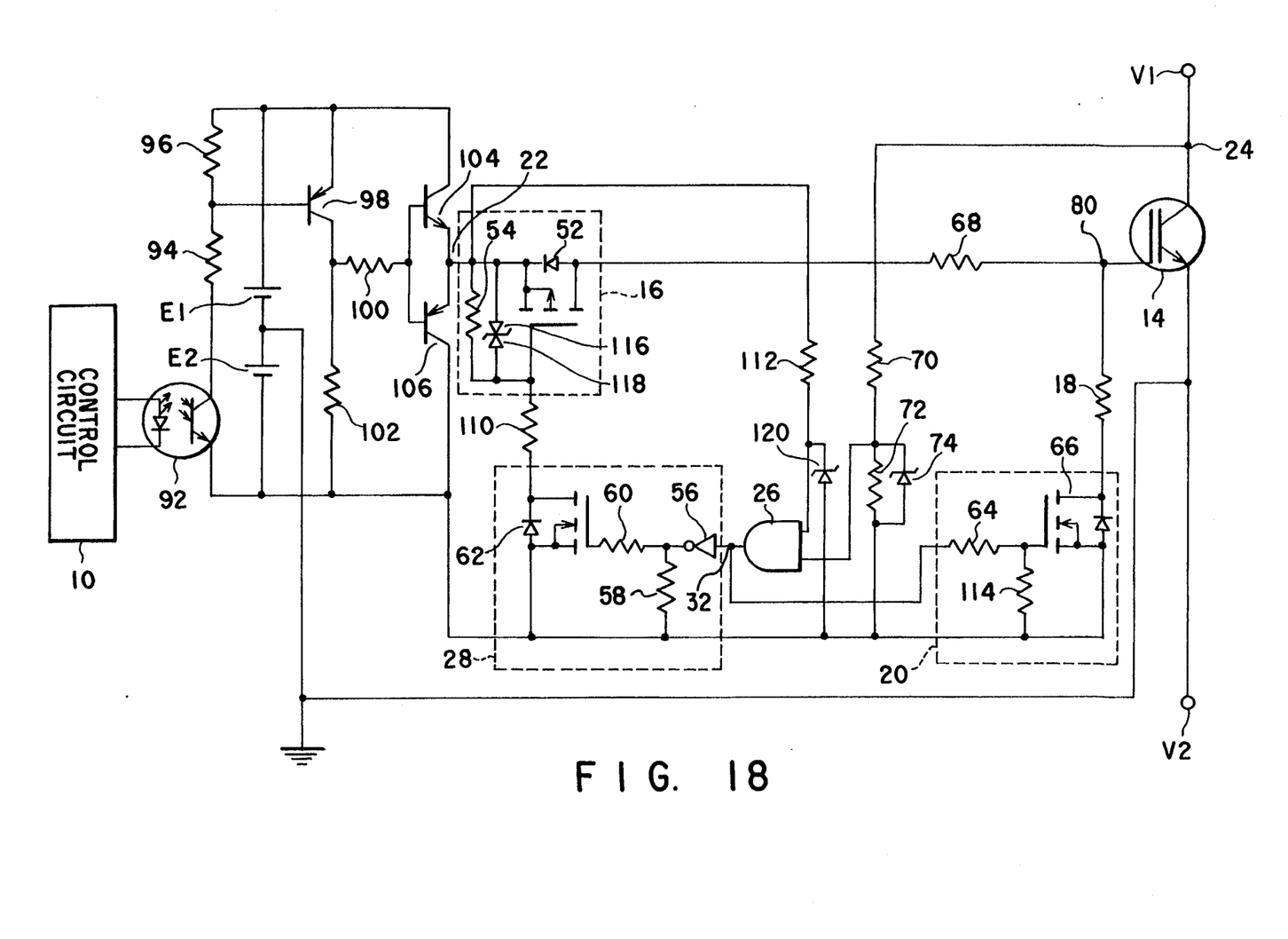
FIG. 18 is a circuit diagram showing the construction of an eighth embodiment of a protective device for protecting a power semiconductor device against a short circuit according to the present invention.

FIG. 18 is a circuit diagram showing the construction of an eighth embodiment which requires positive and negative biases. A photocoupler 92 is operated in response to an output of the control circuit 10. A positive bias power source E1 and negative bias power source E2 are connected to both ends of the current path of the photocoupler 92. A base of a PNP transistor 98 is connected to a serial connection node between series-connected resistors 94 and 96 connected to one end of the current path of the photocoupler 92. The emitter of the transistor 98 is connected to the positive bias power source E1 together with one end of the resistor 96. The collector of the transistor 98 is connected to one end of a resistor 100 and connected to the negative bias power source E2 via a resistor 102. The other end of the resistor 100 is connected to a common base of an NPN transistor 104 and a PNP transistor 106. The collector of the transistor 104 is connected to the positive power source E1 and the collector of the transistor 106 is connected to the negative power source E2. The emitters of the transistors 104 and 106 are connected together and the emitter output terminal thereof is the output node 22 of the driving circuit 12 shown in FIG. 10. Portions which are the same as those of FIG. 10 are denoted by the same reference numerals used in FIG. 10. Those portions which are connected to the ground terminal GND in FIG. 10 are connected to the negative power source E2. The collector of the IGBT 14 is set at a first preset potential V1 and the emitter thereof is set at a second preset potential V2. Further, resistors 110, 112, 114, Zener diodes 116, 118, 120 for adjustment and stabilization of the circuit operation are provided in the respective portions. The principle of the operation of the circuit with the construction of FIG. 18 is the same as that of FIG. 10.

As described above, according to the present invention, a signal obtained at the time of detection of a short circuit can be supplied to a semiconductor device as a turn-off signal before the semiconductor device is broken down, thereby making it possible to stably protect the semiconductor device from breakdown. Further, since the current detector or large-capacitor resistor is not used unlike the conventional case, the device can be easily integrated at a low cost. Since a circuit exclusively used for turning off the short-circuit current is provided in addition to a turn-off circuit used in the normal operation, the short-circuit current can be slowly turned off, thereby preventing occurrence of a spike voltage which may cause the breakdown of the semiconductor device. Further, since the number of parts used is small, the device may be incorporated into a driving circuit and constructed as a hybrid integrated circuit.

Additional advantages and modifications will readily occur to those skilled in the art. Therefore, the present invention in its broader aspects is not limited to the specific details, representative devices, and illustrated examples shown and described herein. Accordingly, various modifications may be made without departing from the spirit or scope of the general inventive concept as defined by the appended claims and their equivalents. For example, an output signal of the driving circuit 12 is input to the AND gate 26 in order to detect the short circuit, but since the driving circuit 12 is used only to amplify an output of the control circuit 10, an output of the control circuit 10 may be input to the AND gate 26.

What is claimed is:

1. A protective device against a short circuit for preventing the breakdown of a semiconductor device caused by the short circuit of a load connected to an output terminal of the semiconductor device, comprising:

means for generating a control signal to control the ON-OFF state of said semiconductor device;

switching means connected between said control signal generation means and a control terminal of said semiconductor device;

means for detecting the short circuit of said load according to the control signal and a level at the output terminal of said semiconductor device;

means for switching off said switching means when a first preset time has passed after said short circuit detection means detects a short circuit, thereby isolating said control means and semiconductor device from each other; and turn-off means, connected to said semiconductor device, for turning off said semiconductor device when a second preset time longer than the first preset time has passed after the short circuit detection means detects a short circuit.

2. A device according to claim 1, further comprising: means for isolating said control means from said semiconductor device by setting said switching means in the OFF state for a third preset time shorter than the first preset time in response to a turn-off control signal generated from said control signal generating means when no short circuit occurs.

3. A device according to claim 1, wherein said turn-off means includes a discharging path for discharging charges in said semiconductor device.

4. A device according to claim 1, wherein said switching means includes a delay circuit for delaying a detection signal of said short-circuit detecting means by the first preset time and then supplying the delayed signal to the control terminal of said switching means.

5. A device according to claim 1, wherein said first preset time is set to be longer than a turn-on time of said semiconductor device and said second preset time is set to be longer than a turn-off time of said semiconductor device and shorter than a breakdown time of said semiconductor device by the short circuit minus a turn-off time of said semiconductor device at the time of short circuit.

6. A device according to claim 1, wherein said semiconductor device is an insulated gate bipolar transistor.

7. A device according to claim 1, wherein said semiconductor device is an insulated gate metal oxide semiconductor transistor.

8. A device according to claim 1, wherein said semiconductor device is a metal oxide semiconductor field effect transistor.

9. A device according to claim 1, wherein said semiconductor device is a bipolar transistor.

10. A protective device against a short circuit for preventing the breakdown of a semiconductor device caused by the short circuit of a load connected to an output terminal of the semiconductor device, comprising: means for generating a control signal to control the ON-OFF state of said semiconductor device;

switching means connected between said control signal generation means and a control terminal of said semiconductor device;

means for detecting the short circuit of said load according to the control signal and a level at the output terminal of said semiconductor device;

means for switching off said switching means when a first preset time has passed after said short circuit detection means detects a short circuit, thereby isolating said control means and semiconductor device from each other; and turn-off means, connected to said semiconductor device, for turning off said semiconductor device when a second preset time longer than the first preset time has passed after the short circuit detection means detects a short circuit, wherein said turn-off means includes:

a series circuit of a resistor and a switching element connected between the control terminal of said semiconductor device and a reference potential terminal; and a delay circuit for delaying an output of said detection means by the second preset time and then supplying the delayed output to the control terminal of said switching means.

11. A protective device against a short circuit for preventing the breakdown of a semiconductor device caused by the short circuit of a load connected to an output terminal of the semiconductor device, comprising:

means for generating a control signal to control the ON-OFF state of said semiconductor device;

switching means connected between said control signal generation means and a control terminal of said semiconductor device;

means for detecting the short circuit of said load according to the control signal and a level at the output terminal of said semiconductor device;

means for switching off said switching means when a first preset time has passed after said short circuit detection means detects a short circuit, thereby isolating said control means and semiconductor device from each other; and turn-off means, connected to said semiconductor device, for turning off said semiconductor device when a second preset time longer than the first preset time has passed after the short circuit detection means detects a short circuit, wherein the control signal indicates an ON state of said semiconductor device when the control signal is set at a logic high level;

the output terminal of said semiconductor device is connected to a positive power source; and said short-circuit detection means includes an AND gate supplied with an output of said control means and an output of said semiconductor device.

* * * * *